United States Patent
Tammaru et al.

[11] Patent Number: 6,049,249
[45] Date of Patent: Apr. 11, 2000

[54] TWT WITH MISMATCHED SECTION FOR CONTROLLED GAIN VARIATION WITH FREQUENCY

[75] Inventors: Ivo Tammaru; James W. Hansen, both of Rancho Palos Verdes, Calif.

[73] Assignee: Hughes Electronics Corporation, El Segundo, Calif.

[21] Appl. No.: 08/925,930

[22] Filed: Sep. 8, 1997

[51] Int. Cl.[7] .............................. H01J 25/34; H03F 3/58
[52] U.S. Cl. .................... 330/43; 315/3.5; 315/3.6
[58] Field of Search ................... 315/3.6, 3.5, 39.3; 330/43

[56] References Cited

U.S. PATENT DOCUMENTS 3,716,745  2/1973  Phillips ................................. 315/3.6
5,162,697  11/1992  Davis et al. ............................ 315/3.6

FOREIGN PATENT DOCUMENTS 432825  9/1977  Russian Federation ................ 315/3.6

*Primary Examiner*—Benny T. Lee
*Attorney, Agent, or Firm*—Bradley K. Lortz; Michael W. Sales; Vijayalakshmi D. Duraiswamy

[57] ABSTRACT

Apparatus compensating for gain variations versus frequency of a traveling wave tube (TWT) is disclosed. The apparatus provides an RF interaction circuit section designed with specified mismatches causing internal reflections of the RF waves, such that the overall gain response is flattened out or inverted.

16 Claims, 4 Drawing Sheets

TWT WITH MISMATCHED SECTION FOR CONTROLLED GAIN VARIATION WITH FREQUENCY

GOVERNMENT RIGHTS STATEMENT

This invention was made with Government support under Contract No. F04701-92-C-0059 awarded by the Department of the Air Force. The Government has certain rights in this invention.

TECHNICAL FIELD

The present invention relates to microwave power tubes and, more particularly, to a traveling wave tube which compensates for variations in gain occurring as a function of frequency.

BACKGROUND ART

Traveling wave tubes ("TWT"), having been developed in the mid 1940's are well known in the prior art. The characteristics of the TWT, namely, wide bandwidth, high gain, moderate peak and average power have resulted in its wide use, frequently replacing previously used microwave power amplifier tubes such as the Klystron. The main disadvantages of the TWT are that its power output capability is often less than that of the Klystron, and that, for a given output power, the TWT operates at a higher voltage. However, in many applications its wide bandwidth greatly outweighs these disadvantages.

One reason for the limitation on the peak power capability is the circuit characteristics of the TWT which make it subject to "backward wave" oscillation when using very high operating voltages. Further, TWTs typically exhibit a gross gain variation versus frequency which is approximately parabolic over the operating range. Thus, the usable, saturated or peak power output comprises a small part of the total bandwidth of the TWT.

Future trends in TWT design are being dictated by system requirements toward higher frequency, greater efficiency, increased reliability, longer life, smaller size, lighter weight, higher power, and improved gain flatness at both small signal and large signal drive levels. TWTs are thus required to operate over a broad range of frequencies and produce a fairly flat radio frequency (RF) output signal over the same frequency range.

In known systems, these requirements have generally led to design tradeoffs which may result in a reduction in efficiency of between 2% to 10% for the TWT. The TWT efficiency achievable depends upon the severity of the bandwidth and the RF flatness requirements imposed on the TWT design.

Additionally, feedback paths around or within the TWT result in gain ripple which also affects the RF output flatness over the frequency range. The effect of such a feedback signal can be either regenerative or degenerative, depending upon the closed loop phase shift. Since a TWT is "electrically long", having a phase length on the order of 10,000°, a small change in frequency can cause the closed loop phase shift to change by 360°. A ripple pattern, with several ripple periods over the operating frequency band, is typically superimposed on the gross parabolic small signal gain characteristic of the tube.

In the prior art, achieving better response with traveling wave tubes, without the use of an equalizer, generally requires widening the performance band so that only the central part of the total band is used. It reduces the effectiveness of the interaction and results in lower tube efficiency and a longer RF circuit. Furthermore, the degree of improvement in gain flatness could be limited. Widening the band will also reduce the frequency separation of the gain peaks of the ripple pattern, which may be undesirable.

SUMMARY OF THE INVENTION

It is an object of the present invention to provide an improved traveling wave tube (TWT) which overcomes some of the limitations associated with known TWTs. Specifically, it is an object of the present invention to reduce or eliminate the parabolic portion of the gain variation with frequency of a TWT and thereby obtain a flatter small-signal and large-signal gain response.

It is another object of the invention to provide a TWT with improved power performance and efficiency at an essentially constant RF drive level with an increase in the effective bandwidth.

The present invention overcomes some of the limitations of known TWTs and TWT systems by providing a TWT which compensates for the approximately parabolic gross gain variation versus frequency which TWTs typically exhibit. This is accomplished by including a special gain-control section in the RF circuit. A gain-control section has specified mismatches (voltage reflection coefficients) at each end, and, in the absence of an electron beam, it is isolated in an RF sense from adjacent amplifying sections. With an electron beam present, the RF signal can be carried, in the forward direction only, by the charge density (or current) modulation of the beam to the amplifying section that follows. The mismatches cause internal reflections of the RF waves, traveling in the forward and backward directions, creating a feedback loop. Since the phase length of the feedback loop increases with frequency, the feedback signal combines with the primary signal in an alternately constructive and destructive relationship, resulting in periodic peaks and valleys of the gain. In the present invention, the length of the gain-control section and its mismatches are designed such that two succeeding gain peaks of appropriate magnitude and frequency separation occur on either side of the natural gain maximum in the uncompensated circuit. With this system the overall gain response is flattened out or even inverted.

The present invention can be used in helix, coupled-cavity, or any other slow-wave circuits. Its applicability depends on the specific RF performance parameters. The method can be implemented with external components that can be adjusted during tube operation or by a fixed internal design. If used in helix circuits, an internal mismatch can be created by truncating the attenuation pattern on the support rods with an abrupt step, or by ending the helix at an appropriate location within the attenuation pattern. Additionally, the frequency adjustment of the response can be made by applying a bias voltage to the helix in the compensating section.

These and further features, aspects, and advantages of the present invention will become better understood with reference to the following detailed description of the invention when viewed in accordance with the appended claims and accompanying drawings.

BRIEF DESCRIPTION OF THE DRAWINGS

FIG. 1b is a graph depicting the parabolic variation of gain over a frequency range of the TWT of FIG. 1a;

FIG. 2a is a block diagram of the circuit configuration in the prior art of FIG. 1a;

BEST MODES FOR CARRYING OUT THE INVENTION

The present invention is directed to using the gain variation or ripple in traveling wave tubes (TWTs) that results from circuit mismatches to compensate for the normal parabolic shaped gain variation versus frequency, providing an essentially flat response over a given frequency band of interest.

Figure 1A:
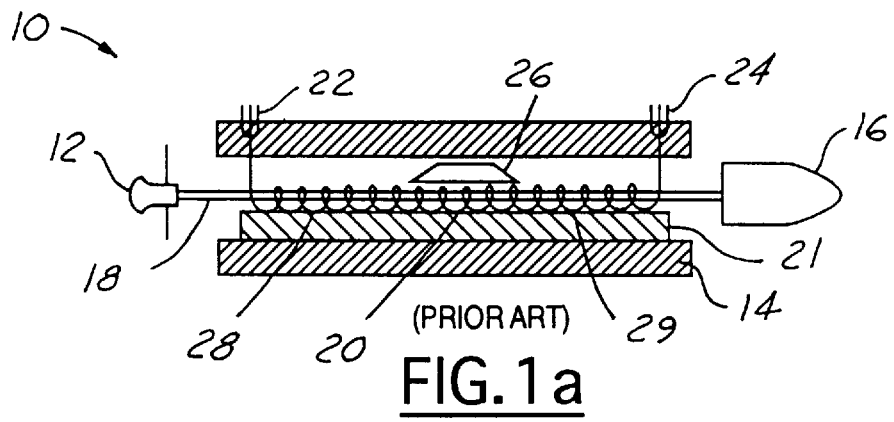
FIG. 1a is a pictorial schematic of a traveling wave tube (TWT) in the prior art.
Figure 9:
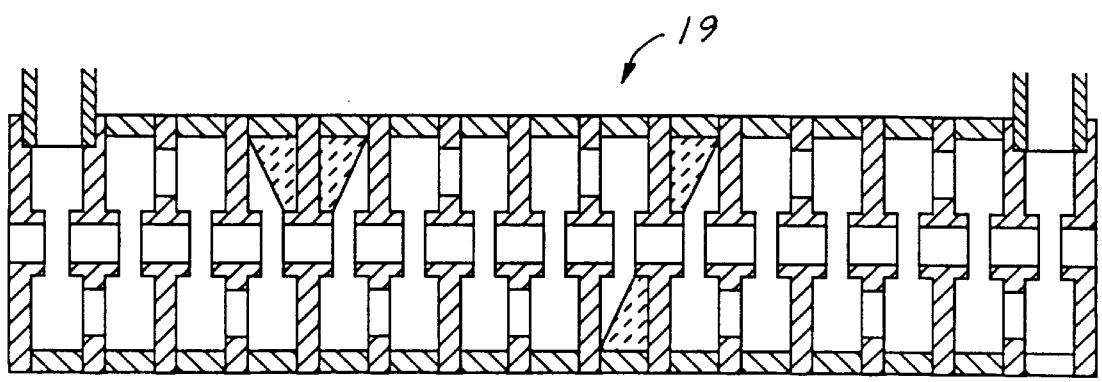
FIG. 9 is a pictorial schematic of a coupled cavity slow wave structure in a TWT.

Referring first to FIG. 1a, there is shown a basic traveling wave tube 10 such as is available in the prior art. Tube 10 includes an electron gun 12 to form and accelerate a beam of electrons 18, a magnetic beam focusing system 14 to direct the electron beam 18 into a collector 16, and an interaction structure. The interaction structure comprises a helix 20 (or coupled cavity 19 or other slow wave circuit illustrated in FIG. 9) having an RF input 22 where a small microwave signal is coupled into the interaction structure. The helix 20 is typically held in place by three dielectric rods. One rod 21 is shown in FIG. 1a. Usually, the rods are symmetrically placed around the helix 20. The structure also includes an RF output 24 where the amplified microwave signal is coupled out of the interaction structure, and an attenuator 26. The electron beam 18, the interaction structure 20, and the attenuator 26 are in a high vacuum environment, maintained inside a shell (not shown) that is joined to the electron gun 12 and collector 16 with vacuum seals. The RF input and RF output are respectively coupled into and out from the shell through ceramic vacuum windows (not shown) which provide a low-reflection RF path to the interaction structure. The RF input and output 22,24 are provided at a preselected microwave frequency.

The attenuator 26 is generally sufficiently strong that it absorbs all RF power propagating toward it from either direction, providing substantially total isolation of the two helix sections on either side, except for the signal carried by the modulated electron beam from the helix input section 28 through the attenuator region to the helix output section 29. Because of the isolating property of the attenuator, the helix may have a break between the input and output sections with no effect on the RF performance. A circuit also may have more than one attenuator, and thus more than two gain sections. The purpose is to limit the gain of the individual amplifying sections and thus minimize the gain ripple due to regenerative feedback.

Figure 1B:
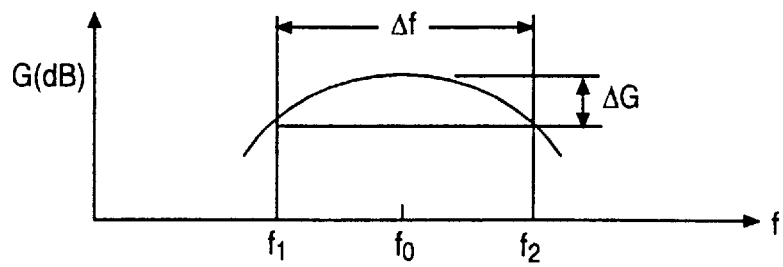

Referring now to FIG. 1b, the TWT circuit provides a gain with a parabolic variation of $\Delta G$ over a frequency range of $\Delta f$, where $\Delta G$ is the variation in gain of TWT 10 over a frequency bandwidth extending from a first frequency, "$f_1$" to a second frequency "$f_2$" with the bandwidth centered about a preselected frequency "$f_0$". Not shown in FIG. 1b is the fine grain ripple pattern that, at small signal levels, is typically superimposed on the gross parabolic gain variation, with several ripple periods over the band $f_1$ to $f_2$. The ripple results from the small but unavoidable mismatches that exist at the ends of each circuit section. Because the output section is generally the longest circuit section, with the highest gain, its ripple is usually the dominant part of the fine-grain gain variation.

Figure 1C:
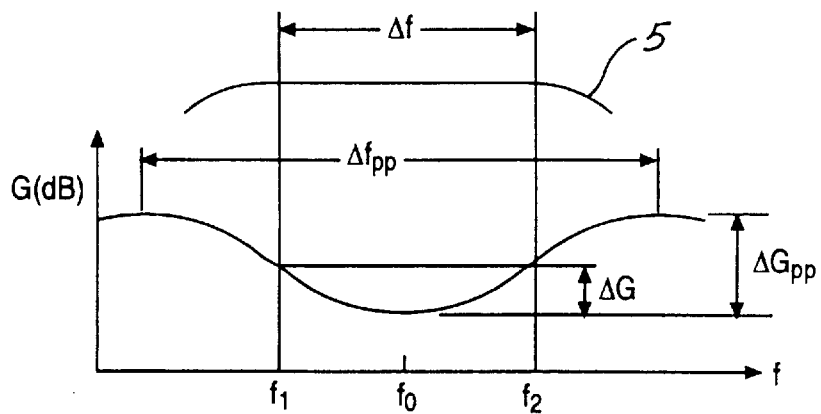
FIG. 1c is a graph depicting the gain ripple pattern resulting from mismatches at the ends of a gain-control circuit section and the overall gain of the TWT.

The present invention makes use of the ripple pattern that results from mismatches at the ends of a circuit section as illustrated in FIG. 1c. If the section parameters can be chosen in such a way that the peak-to-peak ripple amplitude is twice the parabolic variation, that is, $\Delta G_{pp}=2\Delta G$, and the frequency separation between the gain peaks is twice the frequency range $\Delta f$, that is, $\Delta f_{pp}=2\Delta f$, then the parabolic variation of the TWT can be compensated, provided that a gain minimum of the ripple (destructive interference) occurs at the midband operating frequency $f_o$. From FIGS. 1b and 1c it is evident that the above-stated conditions on peak-to-peak gain ripple and frequency separation need only be approximately satisfied to achieve substantial gain flattening 5. Furthermore, it is also clear that the normal gain maximum at $f_0$ can be changed to a gain minimum by choosing $\Delta G_{pp}$ to be greater than two times $\Delta G$ (if $\Delta f_{pp}=2\Delta f$); this makes it possible to have the TWT compensate for gain variations in other components of a signal amplifying chain in a system. Although achieving a flat response 5 is the most likely use of the technique, the degree of compensation is clearly flexible.

The present invention uses a special gain-control circuit section to accomplish the compensation (or "equalization"). Referring to FIG. 1c, the gain variation, $\Delta G$, is shown over the frequency bandwidth $\Delta f$ extending from a first frequency "$f_1$" to a second frequency "$f_2$" with the bandwidth centered about a preselected frequency "$f_0$". The length of the section determines the frequency separation $\Delta f_{pp}$ between successive peaks of the gain ripple pattern (the separation being approximately inversely proportional to the section length, as seen from Equation (10) below), the magnitude of the mismatches establishes the ripple amplitude, and the phasing of the interfering waves determines the frequencies at which constructive and destructive interference occurs (giving rise to gain peaks and gain valleys).

By way of explanation, consider a circuit section of length $L_c$ with voltage reflection coefficients $R_a$ and $R_b$ at the input and output ends of the section. (The input end of a section is that closest to the gun and the output end of a section is that closest to the collector.) Let an RF signal be introduced at the input end of the section, either through an RF input coupler or by an RF modulated electron beam. The signal is amplified in the section by the interaction with the electron beam and acquires a voltage amplitude of $V_1$ at the end of the section. The wave is partly reflected by the mismatch $R_b$. The reflected part returns to the input end, attenuated by the cold circuit loss L. There the reflected wave is again partly reflected by the mismatch $R_a$ and launched toward the output. It is amplified by the section gain G, acquiring a voltage amplitude of $V_2$ at the output end of the section. There the reflected part combines with the original wave $V_1$, modifying the original wave in amplitude and phase. If the axial propagation parameter of the RF wave is $\beta_+$ and $\beta_-$ in the forward and backward directions respectively, and if G and L are expressed in dB, the voltage amplitude $V_2$ is given by:

$$V_2 = V_1 R_b 10^{-L/20} \exp(-j\beta_- L_c) R_a 10^{G/20} \exp(-j\beta_+ L_c) \quad (1)$$

The reflected wave $V_2$ is, in turn, partially reflected by the mismatch $R_b$, attenuated during its backward travel toward the RF input and again partially reflected by the mismatch $R_a$, amplified as it travels toward the output end of the section, creating another reflective wave $V_3$ which combines with the two components $V_1$ and $V_2$, and so on.

The gain of the feedback loop, $g_{loop}$, is the ratio of successive voltage amplitudes:

$$g_{loop} = V_2/V_1 = V_3/V_2 = V_4/V_3 = \ldots \quad (2)$$

and the total wave at the RF output is the sum of all the waves:

$$V_{total} = V_1 + V_2 + V_3 \ldots = V_1[1 + g_{loop} + g_{loop}^2 + \ldots] = V_1/(1 - g_{loop}) \quad (3)$$

The amplitude $g_L$ of the complex loop gain determines the magnitude of the gain ripple and the phase $\phi$ of the loop gain determines the phasing of the frequency response. Separating out the amplitude and phase by:

$$g_{loop} = g_L \exp(j\phi) \quad (4)$$

and writing the complex reflection coefficients $R_a, R_b$ in terms of their amplitudes $\rho_a, \rho_b$, and phase $\theta_a, \theta_b$ by:

$$R_{a,b} = \rho_{a,b} \exp(j\theta_{a,b}) \quad (5)$$

gives the following expressions for the amplitude and phase of the loop gain:

$$g_L = \rho_a \rho_b 10^{(G-L)/20} \quad (6)$$

$$\phi = (\theta_a + \theta_b) - (\beta_+ + \beta_-) L_c \quad (7)$$

The voltage amplitude is at a maximum when the phase $\phi$ equals zero or an even number of $\pi$. At minimum amplitude, $\phi$ is an odd number of $\pi$ and the voltage is $V_1/(1+g_L)$. The ratio of the voltage amplitude without interference ($V_{total} = V_1$) to the minimum amplitude is: $(1+g_L)$. In terms of the gain ripple $\Delta G$ to be compensated (FIG. 1), the voltage amplitude ratio is given by $10^{\Delta G/20}$. Hence:

$$10^{\Delta G/20} = 1 + g_L \quad (8)$$

The frequency separation of two successive interference peaks, which are separated by $2\pi$ in phase, is related to the section length by:

$$\Delta\phi = \Delta(\beta_+ + \beta_-) L_c = 2\pi \quad (9)$$

Since the circuit is designed such that the phase velocity is approximately equal to the electron velocity, one may write $\beta_+ \approx \beta_- \approx \beta_e = \omega/u_o = 2\pi f/u_o$, where $u_o$ is the electron velocity. Thus Eq. (9) gives:

$$L_C = u_o/(2\Delta f_{pp}) \quad (10)$$

Using $\Delta f_{pp} \approx 2\Delta f$, as in FIG. 1, gives:

$$L_C \approx u_o/(4\Delta f) \quad (11)$$

However, the primary determinant of the length of the section is that destructive interference occurs at midband frequency $f_o$. This requires that the loop phase, Eq. (7), be an odd number of $\pi$ radians. Approximating the propagation constants as before results in the following condition:

$$L_C(4f_o/u_o) - (\theta_a + \theta_b)/\pi = \text{an odd integer} \quad (12)$$

$L_C$ is therefore adjusted from the value calculated in Eq. (11) just enough to satisfy (12). In case the phases of both reflection coefficients are either zero or $\pi$, the phase-sum term can be deleted.

The mismatches are calculated from Eqs. (8) and (6). The section gain G is evaluated from the (asymptotic) gain per unit length of the forward wave, $G_1$ (in dB per unit length), corrected for the launching loss, A (in dB), which is characteristic of the TWT interaction. Thus:

$$G = G_1 L_C - A \quad (13)$$

where A is generally in the range of 6 to 9 dB. Similarly, with a circuit cold loss of $L_1$ (in dB per unit length) the loss in the section is:

$$L = L_1 L_C \quad (14)$$

For equal mismatches at either end, $\rho_a = \rho_b = \rho$, the voltage reflection coefficient is given by:

$$\rho = 10^{-(G-L)/40}(10^{\Delta G/20} - 1)^{1/2} \quad (15)$$

In view of the preceding, and by way of example and not by way of limitation, the compensation and voltage reflection coefficient may be determined for a helix traveling wave tube with a parabolic gain variation of 0.5 dB over the band 7.25–7.75 GHz. The tube is operated with a beam voltage of 5280 V, or an electron velocity of 0.1427 of the speed of light. Eq. (11) then gives an approximate length of the equalizing section as $L_c = 0.84$ inches. Assuming the reflection phase sum can be ignored, the phase loop at midband yields $\phi/\pi = L_c(4f_o/u_o) = 15$, which is an odd integer as desired. This condition is accidentally satisfied because of the numerical values of the frequency parameters; by substituting the value of $L_c$ from (11) into (12) one finds $\phi/\pi = f_o/\Delta f = 7.5/0.5 = 15$.

In the design of an actual device, the phases of the mismatches need to be established and included in evaluating the loop phase from Eq. (12).

Assuming the tube has a forward gain per unit length of $G_1 = 13$ dB/inch, a cold circuit loss of $L_1 = 1.0$ dB/inch, and that A is 6 dB, the difference (G−L) to be used in Eq. (15) is:

$$G - L = (13 L_c - 6) - 1.0 L_c = 12 L_c - 6 = 4.08 \quad (16)$$

To compensate for a $\Delta G$ of 0.5 dB, the voltage reflection coefficient at each end is 19%.

As can be seen from the above, the performance of the gain-control section is determined by three parameters. The first parameter is the phase of the feedback loop within a normalized range of zero to 2π, whereby a maximum gain attenuation occurs at a frequency where the phase is π. In the second parameter, the magnitude of the mismatches determines the amount of maximum gain attenuation. Finally, in the third parameter, the total phase length (the approximate number of wavelengths) of the feedback loop establishes the frequency separation between the gain peaks due to the gain-control section. Total phase length, however, is less critical than the phase of the feedback loop or the magnitude of the mismatches. As hereinafter discussed, adjustment of these parameters during TWT operation enhances the flexibility for compensation and optimum performance.

Figure 2A:
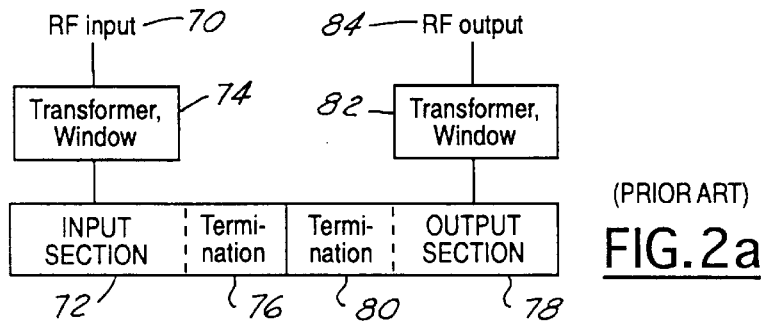

FIG. 2a illustrates, in block diagram form, the essential elements of the circuit configuration, corresponding to the prior art tube 10 described in FIG. 1a. The RF input signal 70 is coupled into the input section 72 through a combination transformer and vacuum window 74, designed to provide a low-reflection match between the wave guide from a signal source and the input section of the helix circuit. At the output end of the input section, the RF wave traveling on the circuit is absorbed in what is designated a "termination" 76. In this and subsequent figures, a "termination" has the property that it absorbs substantially all the power traveling toward it on the circuit with little or no reflection. The output section 78, adjoined to the output end of the input section, has a termination 80 at the input end and a transformer-window coupler 82 at the output end where the RF output signal 84 is output. The termination in the output section absorbs any RF power traveling backward from the output coupler with little or no reflection. The two terminations in FIG. 2a are represented by the two halves of the attenuator 26 in FIG. 1a.

Figure 2B:
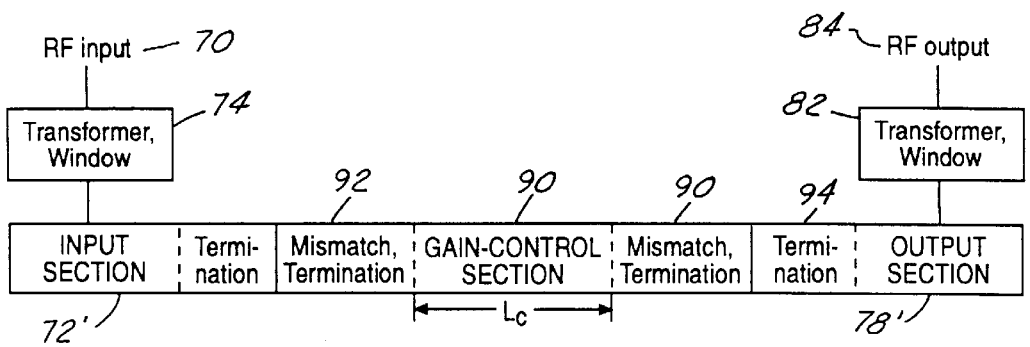
FIG. 2b is a block diagram illustrating the circuit configuration in FIG. 2a modified in accordance with the present invention.

FIG. 2b illustrates one application of the invention in relation to the circuit configuration of FIG. 2a where like reference numeral describe the features as described with reference to FIG. 2a. A gain-control section 90 is inserted between the input and output sections 72' and 78', with each end having a combination mismatch-termination 92 and 94, such that some part of the RF power traveling toward each end is first reflected by the mismatch before being absorbed by the termination.

Figure 3:
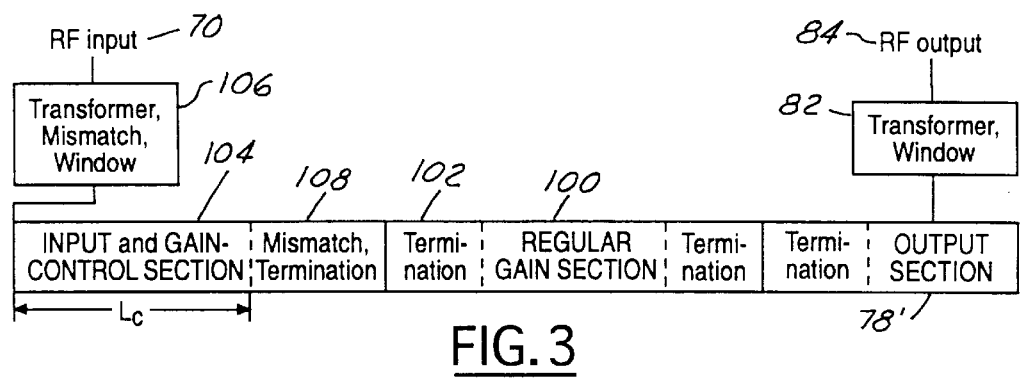
FIG. 3 is a block diagram illustrating an alternate modification of the circuit configuration in FIG. 2a in accordance with the present invention.

FIG. 3 illustrates a second application of the invention in relation to the circuit configuration of FIG. 2a where like reference numerals describe the features as described with reference to FIGS. 2a and 2b. The input section in FIG. 2a has been converted to the regular gain section 100 in the middle of the circuit in FIG. 3, by replacing its input coupler (with transformer-window) with a termination 102, and a new input and gain-control section 104 has been added at the beginning of the circuit. The added gain-control section has an input coupler at the input end, where the combination transformer-window 106 now also has a mismatch; the output end has a mismatch-termination 108. This configuration has the advantage over that in FIG. 2b by having one of the mismatches of the gain-control section automatically outside the vacuum envelope for possible adjustment during tube operation, but its disadvantage is that the reflected power from the mismatched input section may affect the power from the signal source, and hence an isolator may have to be used.

Figure 4:
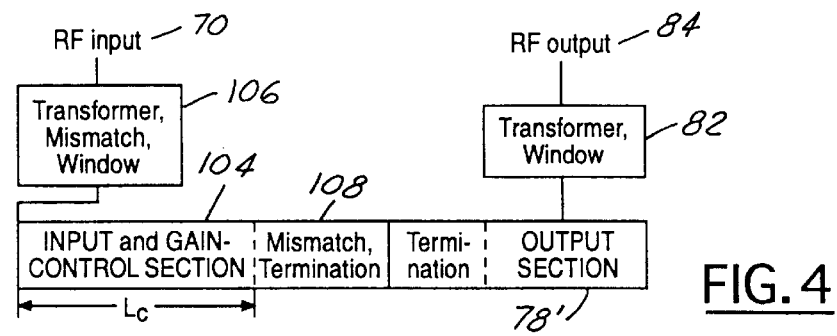
FIG. 4 is a block diagram illustrating the circuit configuration in a low gain device in accordance with the present invention.

In FIG. 4 where like reference numerals describe the features as described with reference to FIG. 3, the middle gain section in FIG. 3 is absent. This configuration accomplishes equalization of the gain in what would otherwise be a single-section device. It has the same advantages and disadvantages as the configuration in FIG. 3, except for the additional advantage of providing isolation between the RF input and output couplers that a conventional single-section circuit lacks.

Figure 5A:
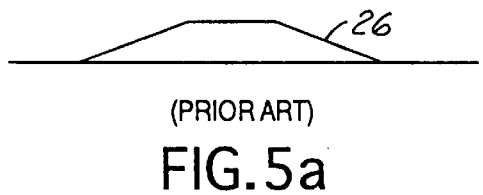
FIG. 5a shows a representative density pattern of attenuation material deposited on a helix support rod and functioning as a circuit attenuator.

Mismatches in the gain-control section can be internal or external to the vacuum envelope. Internal mismatches do not need extra vacuum windows, but they are generally not adjustable. One embodiment of an internal mismatch is to truncate the attenuator 26. The attenuator is made by coating the helix dielectric support rods with carbon or other lossy material. A representative (prior art) loss coating density versus axial distance is illustrated in FIG. 5a. By introducing the lossy coating gradually, the RF is absorbed with a minimum reflection.

Figure 5C:
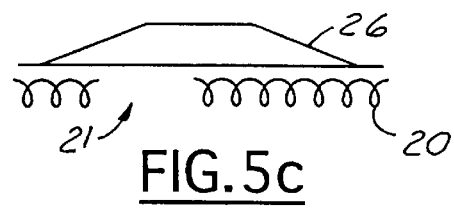
FIG. 5c shows a helix having a free end located within the gradually changing attenuator loss pattern.
Figure 5B:
FIG. 5b shows the attenuator of FIG. 5a having a portion of the attenuating material removed to provide an abrupt step resulting in a deliberate RF mismatch.

A truncated loss coating that provides an RF mismatch according to the present invention is shown in FIG. 5b. To achieve a mismatch, the lossy material 26' is abruptly terminated or stepped 27. The magnitude of the mismatch specified by the reflection coefficient R, can be adjusted by the size of the abrupt step. This implementation requires that the phase of the voltage reflection coefficient be known and that the location of the mismatch be well controlled. For maximum control of this implementation, each of the dielectric support rods should have the same step in the lossy pattern, with the step accurately positioned at the same axial location during assembly.

An alternate method is to terminate the helix with a free end at an appropriate location within the gradually changing attenuator loss pattern 26.

FIG. 5c shows the helix 20 with a gap 21 that is located toward one end of the attenuator pattern 26 such that one end of the helix is within a gradually increasing portion of the attenuator pattern 26.

Other methods, which disrupt the uniformity of the basic helix RF circuit structure at selected locations within the attenuator pattern and thereby provide an internal mismatch, can readily be implemented. These include depositing a metallic material on the support rods in some appropriate pattern, or introducing a discontinuity in the helix by an abrupt change in pitch.

Figure 6:
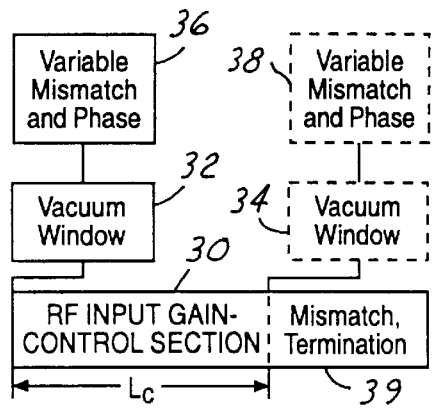
FIG. 6 is a block diagram illustrating one system of the present invention.

Since the performance of the gain-control section depends on the product of the two mismatches at either end, a tube can be empirically optimized with an adjustable external mismatch at one end, provided the mismatch at the other end is somewhere within an acceptable range. FIG. 6 illustrates the general embodiment of a gain-control section with at least one external adjustable mismatch (variable mismatch and phase outside the vacuum envelope). The external mismatch section 36 is coupled through a vacuum window 32 to the interaction circuit at the input end of the gain-control section 30. The vacuum window 32 is an impedance matching device that allows transmission of RF power with minimum power reflection between the RF circuit existing in a high-vacuum environment and a suitable wave guide at ambient pressure. Use of the vacuum window 32 permits the mismatch section 36 to be interfaced with the interaction circuit of the gain-control section 30 with minimum additional mismatches. The window-mismatch combination could also be at the output end of the gain-control section. This is indicated by the dashed components 34 and 38, which would now replace the mismatch-termination combination 39.

The variable mismatch and phase elements of sections 36, 38 allow adjustment of the reflection coefficients and the phase during TWT operation. Proper selection of the mismatch sections 36, 38 will result in the conditions above described for FIG. 1c, wherein $\Delta G_{pp} \approx 2\Delta G$ and $\Delta f_{pp} \approx 2\Delta f$, and where a gain minimum of the ripple (destructive interference) occurs at the midband frequency, $f_0$. Among the elements which may be used in mismatch sections 36, 38 are terminations that are essentially resistive loads.

In an alternate embodiment, the external terminations can have both resistive and reactive components. These allow varying both the magnitude and phase of the reflection coefficient (within a limited phase range). Additionally, the sections can have transmission lines of different electrical lengths thereby permitting the phase length to be adjusted.

Figure 7:
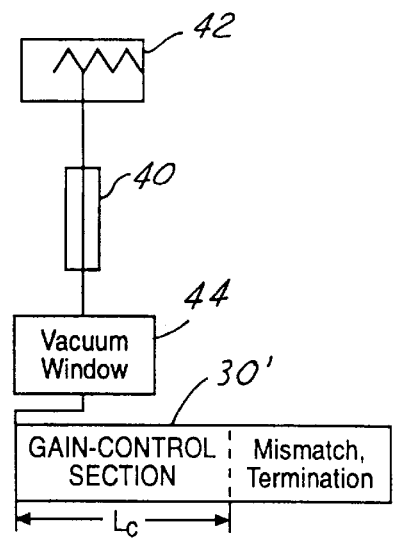
FIG. 7 is a block diagram of the system of FIG. 6 including a specific arrangement utilizing resistive mismatching in accordance with the present invention.

FIG. 7 shows an embodiment of the adjustable mismatch in FIG. 6 using a transmission line 40 (variable phase) and resistive load mismatch 42. A resistive mismatch termination 42 is coupled through vacuum window 44 to the input end of the TWT gain-control section 30'. Another resistive mismatch termination (not shown) could also be coupled through a second vacuum window to the output end of the gain-control section 30'.

The maximum phase adjustment that typically may be required for the feedback loop is $\pi$. As the transmission line is traversed twice by the loop signal, its electrical length needs to be at most a quarter wavelength. With reference to the above described example of a device operating at 7.5 GHz, a quarter wavelength at 7.5 GHz corresponds to a line length of approximately one quarter inch, assuming a standard coaxial cable having a relative dielectric constant of 2.0.

Figure 8:
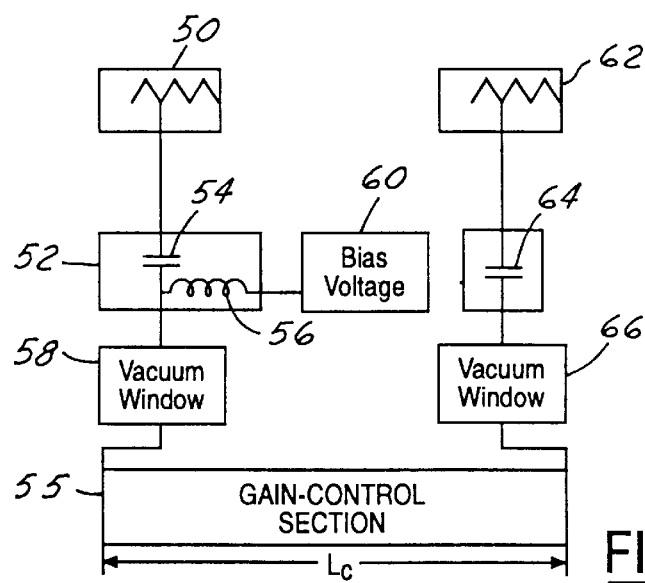
FIG. 8 is a block diagram of the invention providing adjustable parameters in the compensating section.

FIG. 8 illustrates an alternate embodiment of the invention, wherein phase adjustment is accomplished by adjusting the voltage of the DC-isolated helix in the gain-control section. Phase adjustment is possible because the propagation constant of the interacting RF wave in the section is somewhat dependent on the electron beam velocity, which is adjusted with the voltage. Access to the helix for external voltage adjustment is provided by attaching one end of the isolated helix wire inside the section to the center conductor of a low-reflection RF vacuum window in a well-known manner. The other end may similarly be coupled out through a like window (as illustrated in FIG. 8), or it may have a free end in an attenuator region, allowing the use of an internal mismatch (with a truncated attenuator pattern, as in FIG. 5b for example, or a free end in the gradually changing part of the attenuator pattern as in FIG. 5c); in the latter case, the lossy deposit on the helix support rods must either make no contact with the helix wire or make no contact with the surrounding shield, to maintain a high DC resistance between the helix and ground (the tube body).

In the embodiment shown in FIG. 8, mismatch section 50 is coupled through a bias tee section 52, consisting of a DC blocking capacitor 54 and an RF blocking coil 56, and through a vacuum window 58 into the input end of the gain-control section 55. A bias voltage source 60 is coupled into bias tee 52 through coil 56 and provides for phase adjustment as further explained below.

Mismatch section 62 is coupled through a DC blocking capacitor 64 and vacuum window 66 to the output end of gain-control section 55. It is understood that within the scope of the invention, the bias tee which is connected to the input end of the gain-control section, could also have been connected to the output end instead, with the DC block connected to the input end. Both the bias tee 52 and the DC blocking capacitors 54 and 64 are known devices.

The phase adjustment results from the dependence of the propagation constant of the forward wave, $\beta_+$, on the electron velocity or equivalently on the "electron propagation constant", $\beta_e = 2\pi f/u_o$. As the backward wave is unaffected by the electron velocity, its contribution to the loop phase does not change with voltage. The total phase change is therefore due to the forward part of the loop gain, or $\Delta\phi = -\Delta\beta_+ L_c$. To first approximation, $\beta_+$ equals $\beta_e$; evaluating $\Delta\beta_e = -0.5\,(\Delta V_0/V_0)\beta_e$, where $V_0$ is the beam voltage, and $\Delta V_0$ is the change in beam voltage gives $\Delta\phi = 0.5\,(\Delta V_0/V_0)\beta_e L_c$. (For a beam with an electron velocity $u_o$, the beam voltage $V_0$ is the potential rise through which an electron initially at rest has to travel to acquire the velocity $u_o$). However, a better approximation is found in Beam and Blattner, RCA Review, March 1956 as:

$$\Delta\phi = -\Delta\beta_+ L_c \approx 0.29\,\pi(\Delta V_0/V_0)\beta_e L_c = 0.58\,\pi(\Delta V_0/V_0)\,N, \qquad (17)$$

where N is the circuit length $L_c$ in wavelengths given by $N = \beta_e L_c/(2\pi)$. Thus, for a maximum phase shift of $\pi$, the change in beam voltage is $\Delta V_0/V_0 = 1.72/N$. Using the example previously given, $N=7.5/2=3.75$, so $\Delta V_0/V_0$ is 0.46. Thus, for this particular embodiment, the change in voltage required to get the full $\pi$ phase shift is relatively large, possibly too large to be implemented in practice. However, this embodiment may be suitable in other tube designs or for situations where only a small amount of phase adjustment is desired.

Although the foregoing descriptions of implementing the compensation schemes have been for a helix or helix-derived slow-wave circuit, equivalent methods can be applied to a coupled-cavity circuit. A mismatch at a termination cavity is readily obtained by modifying the cavity configuration (such as the coupling aperture to the termination cavity or the gap dimension). Phase control can be achieved by changing the distance (electrical length) between the last interaction gap and the termination ceramic, with or without a vacuum window.

Although particular embodiments of the present invention have been illustrated in the accompanying drawings and described in the foregoing detailed description, it is to be understood that the present invention is not to be limited to just the embodiments disclosed, but that they are capable of numerous rearrangements, modifications and substitutions without departing from the scope of the claims hereafter.

What is claimed is:

1. A slow wave RF amplifier circuit housed within a vacuum envelope, said amplifier circuit having an an RF input section and an RF output section, said amplifier circuit having an amplification gain variation, $\Delta G$, over a frequency range $\Delta f$, centered on a preselected frequency $f_0$, said amplifier circuit comprising:

a Gain Control Section (GCS) having a length $L_C$, said GCS coupled between said RF input section and said RF output section;

a first mismatch section coupled between said RF input section and said GCS, said first mismatch section having a voltage reflection coefficient, $R_a$;

a second mismatch section coupled between said GCS and said RF output section, said second mismatch section having a voltage reflection coefficient, $R_b$; and said first and second mismatch sections operative to create internal reflections in the GCS which produce a ripple signal therein effective to modify said gain variation, $\Delta G$, over said frequency range, $\Delta f$.

2. The circuit of claim 1 wherein said voltage reflection coefficients, $R_a$ and $R_b$, and said GCS length, $L_C$, are preselected such that said ripple signal has a peak-to-peak frequency separation, $\Delta f_{pp}$, centered about said preselected frequency, $f_0$ and a peak-to-peak ripple amplitude, $\Delta G_{pp}$, and further preselected such that:

$$\Delta f_{pp} \approx 2\Delta f;$$

and $$\Delta G_{pp} \approx 2\Delta G;$$

where the gain variation, $\Delta G$, is modified over the frequency range, $\Delta f$.

3. The amplifier circuit of claim 2 wherein at least one of said first and second mismatch sections is internal to said vacuum envelope.

4. The amplifier circuit of claim 3 wherein said slow wave circuit is a helix having an attenuator and said at least one internal mismatch section is achieved by said helix having a free end defining a gap toward one end of said attenuator.

5. The amplifier circuit of claim 3 wherein said slow wave circuit is a helix supported by dielectric rods having a truncated attenuator pattern, thereby providing said at least one internal mismatch section.

6. The amplifier circuit of claim 3 wherein said slow wave circuit is a coupled cavity circuit.

7. The amplifier circuit of claim 2 wherein at least one of said first and second mismatch sections is external to said vacuum envelope.

8. The amplifier circuit of claim 7 wherein said at least one of said first and second mismatch sections that is external is variable and coupled to said GCS.

9. The amplifier circuit of claim 8 wherein said variable mismatch is achieved through a resistive load coupled to said GCS.

10. The amplifier circuit of claim 9 wherein said at least one external variable mismatch section further comprises a segment of transmission line coupled between said resistive load and said GCS.

11. The amplifier circuit of claim 7 further comprising:
   a DC blocking element coupled between said at least one of said first and second mismatch sections that is external and said GCS; and
   a bias voltage supply coupled through an RF blocking element to said DC blocking element for inserting a DC bias voltage on said GCS to adjust the phase of the ripple signal.

12. The amplifier circuit of claim 11 wherein another of said at least one of said first and second mismatch sections is external to said vacuum envelope and further comprises:
   a resistive section; and
   a DC blocking element coupled between said resistive section and said GCS.

13. A slow wave RF amplifier circuit housed within a vacuum envelope, said amplifier circuit having an RF output section, said amplifier circuit having an amplification gain variation, $\Delta G$, over a frequency range, $\Delta f$, centered on a preselected frequency, $f_0$, said amplifier circuit comprising:
   an RF input and gain control section having a length, $L_C$;
   a first mismatch section externally coupled to said RF input and gain control section, said first mismatch section having a voltage reflection coefficient, $R_a$;
   a second mismatch section coupled between said RF input and gain control section and said RF output section, said second mismatch section having a voltage reflection coefficient, $R_b$; and
   said first and second mismatch sections operative to create internal reflections in the RF input and gain control section which produce a ripple signal therein effective to modify the gain variation, $\Delta G$, over said frequency range, $\Delta f$.

14. The amplifier circuit of claim 13 wherein said voltage reflection coefficients, $R_a$ and $R_b$, and said GCS length, $L_C$, are preselected such that said ripple signal has a peak-to-peak frequency separation, $\Delta f_{pp}$, centered about said preselected frequency, $f_0$ and a peak-to-peak ripple amplitude, $\Delta G_{pp}$, and further preselected such that:

$$\Delta f_{pp} \approx 2\Delta f;$$

and $$\Delta G_{pp} \approx 2\Delta G;$$

where the gain variation, $\Delta G$, is modified over the frequency range, $\Delta f$.

15. The amplifier circuit of claim 14 further comprising a regular gain section coupled between said second mismatch section and said RF output section.

16. The amplifier circuit of claim 15 wherein said first mismatch section is variable and coupled to said RF input and gain control section.

* * * * *